United States Patent
Lee

(10) Patent No.: US 7,321,649 B2
(45) Date of Patent: Jan. 22, 2008

(54) PHASE LOCKED LOOP WITH IMPROVED PHASE LOCK/UNLOCK DETECTION FUNCTION

(75) Inventor: Jae-hoon Lee, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 774 days.

(21) Appl. No.: 10/747,486

(22) Filed: Dec. 29, 2003

(65) Prior Publication Data

US 2004/0150480 A1    Aug. 5, 2004

(30) Foreign Application Priority Data

Feb. 5, 2003    (KR) .................... 10-2003-0007158

(51) Int. Cl.
*H03D 3/24* (2006.01)
(52) U.S. Cl. .................. 375/376; 327/156; 331/1 A
(58) Field of Classification Search ............ 375/376; 327/156; 331/1 A
See application file for complete search history.

(56) References Cited

U.S. PATENT DOCUMENTS

| | | | |
|---|---|---|---|
| 4,201,945 A | | 5/1980 | Ohgishi et al. |
| 4,437,072 A | * | 3/1984 | Asami .................... 331/1 A |
| 4,862,105 A | * | 8/1989 | Walbrou et al. .......... 331/1 A |
| 5,008,635 A | * | 4/1991 | Hanke et al. ............. 331/1 A |
| 5,126,690 A | * | 6/1992 | Bui et al. ................. 331/1 A |
| 5,668,503 A | | 9/1997 | Gersbach et al. |
| 5,870,002 A | * | 2/1999 | Ghaderi et al. ........... 331/17 |
| 5,969,576 A | | 10/1999 | Trodden |
| 6,133,769 A | * | 10/2000 | Fontana et al. ........... 327/156 |
| 7,082,178 B2 | * | 7/2006 | Meltzer .................... 375/376 |
| 2003/0112913 A1 | | 6/2003 | Balasubramanian |

FOREIGN PATENT DOCUMENTS

EP    0704977 A2    4/1996

* cited by examiner

*Primary Examiner*—Mohammed Ghayour
*Assistant Examiner*—Juan Alberto Torres
(74) *Attorney, Agent, or Firm*—F. Chau & Assoc., LLC

(57) ABSTRACT

A phase locked loop (PLL) having an improved phase unlock detection function generates a clock pulse signal at a frequency from a synchronization signal of a cathode ray tube (CRT) monitor and includes a phase frequency detector (PFD), a charge pump, a loop filter, a Voltage Controlled Oscillator (VCO), a divider, a phase unlock detection circuit, a phase lock/unlock detection circuit, and an output circuit. The phase unlock detection circuit detects an initial generation of a phase unlock from the up or down signal, outputs a first detection signal, and outputs an internal control signal according to the up or down signal. The phase lock/unlock detection circuit outputs a second detection signal, in response to the internal control signal and the first detection signal. The output circuit performs a logic operation on the first detection signal and the second detection signal and outputs a third detection signal.

16 Claims, 5 Drawing Sheets

PHASE LOCKED LOOP WITH IMPROVED PHASE LOCK/UNLOCK DETECTION FUNCTION

BACKGROUND OF THE INVENTION

1. Technical Field

The present invention relates to a Phase Locked Loop (PLL), and more particularly to a PLL with an improved phase lock/unlock detection function.

2. Discussion of the Related Art

A Cathode Ray Tube (CRT) monitor is a representative example of the peripheral equipment used with a computer for displaying video signals (e.g., R, G, B) on a screen, according to a horizontal synchronization signal H_Sync and a vertical synchronization signal V_Sync transmitted from a video card of the computer.

When the mode of the CRT monitor switches or power is turned on or off, a transient phenomena occurs in which the frequencies of the horizontal synchronization signal H_Sync and vertical synchronization signal V_Sync vary significantly. This transient phenomena typically induces a surge voltage, resulting in a voltage that can destroy components such as diodes, transistors, etc.

An example of the mode being switched in a CRT monitor is when there is a switch from DOS mode to Windows mode. In DOS mode, the frequency of the horizontal synchronization signal H_Sync is about 31 kHz and in Windows mode, the frequency is about 68 kHz. As described above, when the mode of the CRT monitor is switched, frequency variations of the horizontal synchronization signal H_Sync and the vertical synchronization signal V_Sync are significant.

While this is taking place a PLL generates a clock pulse signal with a predetermined frequency from the horizontal synchronization signal H_Sync and the vertical synchronization signal V_Sync, according to a Microcomputer (Micom), and further controls the vertical deflection and horizontal deflection of an electron beam. The PLL additionally provides phase lock/unlock information to the Micom, which allows the Micom to perform controlling functions according to the phase lock/unlock information. The frequency variation of the horizontal synchronization signal H_Sync and the vertical synchronization signal V_Sync generates a phase unlock of the PLL. The Micom can recognize the mode of the switching state of the CRT monitor according to the phase unlock information received from the PLL. If the Micom recognizes the mode of the switching state, the Micom will suppress an abnormally high voltage (e.g., a surge voltage).

Accordingly, quick phase unlock detection by the PLL is important for allowing the Micom to quickly perform, for example, a voltage suppression, when the mode of the CRT monitor is switched.

An example of a PLL with a phase lock/unlock detection function is disclosed in U.S. Pat. No. 6,133,769, issued Oct. 17, 2000, entitled "Phase Locked Loop With A Lock Detector." A PLL with a phase lock/unlock detection function will be described in detail with reference to FIGS. 1-3.

Referring to FIG. 1, a PLL 10 includes a Phase Frequency Detector (PFD) 11, a charge pump 12, a loop filter 13, a Voltage Controlled Oscillator (VCO) 14, a divider 15, and a phase lock/unlock detection circuit 16.

The PFD 11 compares a phase and frequency of an input synchronization signal SIN to the phase and frequency of a reference synchronization signal SREF, and generates an up signal UP or a down signal DN.

The charge pump 12 controls a charge or discharge of the loop filter 13 according to the up signal UP or the down signal DN. The output frequency of the VCO 14 is determined according to the loop voltage of the loop filter 13. The VCO 14 outputs a predetermined clock pulse signal SOUT with the frequency determined according to the loop voltage.

The divider 15 divides the clock pulse signal SOUT and outputs the reference synchronization signal SREF. The phase lock/unlock detection circuit 16 monitors the output of the up signal UP or down signal DN, detects a phase lock/unlock state, and outputs a detection signal DET to a Micom (not shown).

The configuration and operation of the phase lock/unlock detection circuit 16 will now be described with reference to FIG. 2.

Referring to FIG. 2, the phase lock/unlock detection circuit 16 includes a NOR gate 17, current sources I1 and I2, a switching unit 18, a capacitor C1, and a comparator 19.

The NOR gate 17 receives and performs a NOR-operation on an up signal UP and a down signal DN. The switching unit 18 is connected between the current source I1 and a NODE 1, and the current source I2, and is turned on or turned off by the output signal of the NOR gate 17.

The capacitor C1 receives electric charge(s) from the current source I1 via the node NODE1 when the switching unit 18 is turned off.

The comparator 19 compares a voltage VC of the node NODE1 to a predetermined reference voltage VREF, and outputs a detection signal DET at a "high" or "low" level. To allow the comparator 19 to stably detect phase lock/unlock information, the reference voltage VREF has a hysteresis characteristic and the current source I1 is set to a small value. As a result, a time delay exists from the initial generation of phase unlock to the detection of the phase unlock by the comparator 19.

The operation of the phase lock/unlock detection circuit 16 in the PLL 10, will now be described with reference to FIG. 3.

Referring to FIG. 3, the PFD 11 generates an up signal UP or down signal DN when a phase difference is generated between the input synchronization signal SIN and the reference synchronization signal SREF.

The level of the voltage VC of the node NODE1 increases gradually according to the up signal UP or down signal DN. The comparator 19 outputs a detection signal DET at a "high" level when the level of the voltage VC is higher than that of a high reference voltage VREFH.

The charge pump 12 controls charge or discharge of the loop filter 13 according to the up signal UP or down signal DN, and the VCO 14 controls the output frequency of the clock pulse signal SOUT according to the loop voltage of the loop filter 13. By operating the PLL 10 as such, the phase difference between the input synchronization signal SIN and the reference synchronization signal SREF is gradually reduced, and the output count of the up signal UP or the down signal DN is gradually reduced.

As a result, the capacitor C1 of the phase lock/unlock detection circuit 16 is discharged and the level of the voltage VC of the node NODE1 is gradually lowered as shown in FIG. 3.

As further shown in FIG. 3, the comparator 19 outputs a detection signal DET at a "low" level when the level of the voltage VC is lower than that of a low reference voltage VREFL. When this occurs, a Micom (not shown) determines a phase unlocked state if the detection signal DET is "high" and a phase locked state if the detection signal is "low".

However, since the phase lock/unlock detection circuit of the PLL 10 detects a phase unlock after a delay time TD of dozens of ms (millisecond) elapses from an initial generation U of the phase unlock, it is difficult to quickly provide phase unlock information to the Micom in communication with the PLL 10. As a result, a problem exists in that the Micom cannot quickly perform a control operation such as suppressing a surge voltage, etc. when the mode of a CRT monitor is switched.

SUMMARY OF THE INVENTION

The present invention provides a Phase Locked Loop (PLL) with an improved phase lock/unlock detection function, for improving system stability when the mode of a Cathod Ray Tube (CRT) monitor is switched by quickly detecting the initial generation of a phase unlock without a time delay.

According to an aspect of the present invention, there is provided a PLL which generates a clock pulse signal at a frequency from a synchronization signal of a CRT monitor, the PLL comprising a Phase Frequency Detector (PFD), a charge pump, a loop filter, a Voltage Controlled Oscillator (VCO), a divider, a phase unlock detection circuit, a phase lock/unlock detection circuit, and an output circuit. The PFD compares a phase and frequency of a synchronization signal to that of a reference signal, and outputs an up or down signal. The charge pump outputs a pumping current in response to the up or down signal. The loop filter outputs a control voltage according to the pumping current. The VCO outputs a clock pulse signal having a frequency determined by a control voltage. The divider divides the clock pulse signal by a division ratio and outputs a reference signal. The phase unlock detection circuit detects an initial generation of a phase unlock from the up or down signal, outputs a first detection signal, and outputs a first internal control signal according to the up or down signal. The phase lock/unlock detection circuit outputs a second detection signal, in response to the first internal control signal and the first detection signal. The output circuit performs a logic operation on the first detection signal and the second detection signal, and outputs a third detection signal.

BRIEF DESCRIPTION OF THE DRAWINGS

The above features of the present invention will become more apparent by describing in detail exemplary embodiments thereof with reference to the attached drawings, in which.

DETAILED DESCRIPTION OF EXEMPLARY EMBODIMENTS

Figure 1:
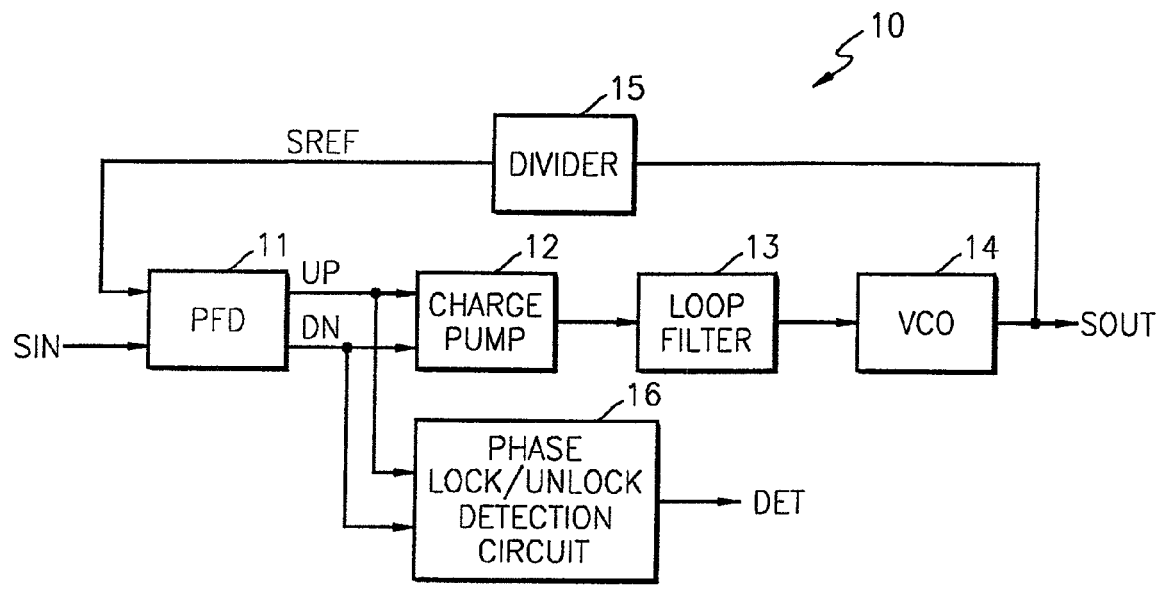
FIG. 1 is a block diagram of a Phase Locked Loop (PLL) with a phase lock/unlock detection function.
Figure 2:
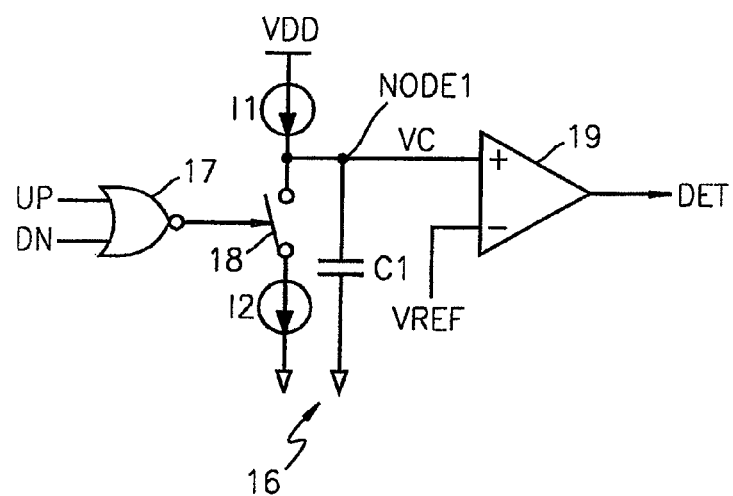
FIG. 2 is a detailed circuit diagram of the phase lock/unlock detection circuit of FIG. 1.
Figure 3:
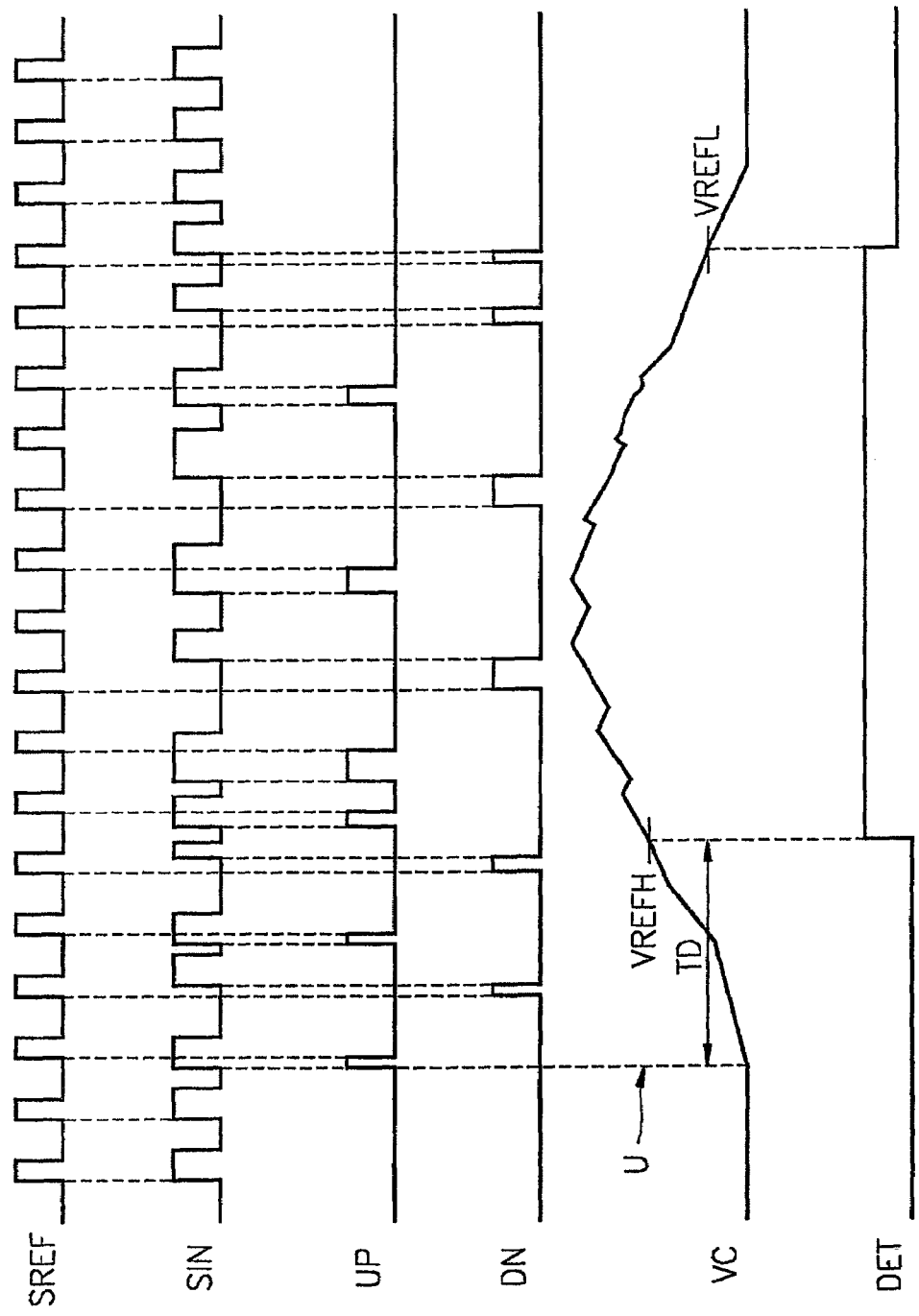
FIG. 3 shows timing diagrams of several signals related to the operation of the phase lock/unlock detection circuit of FIG. 2.
Figure 4:
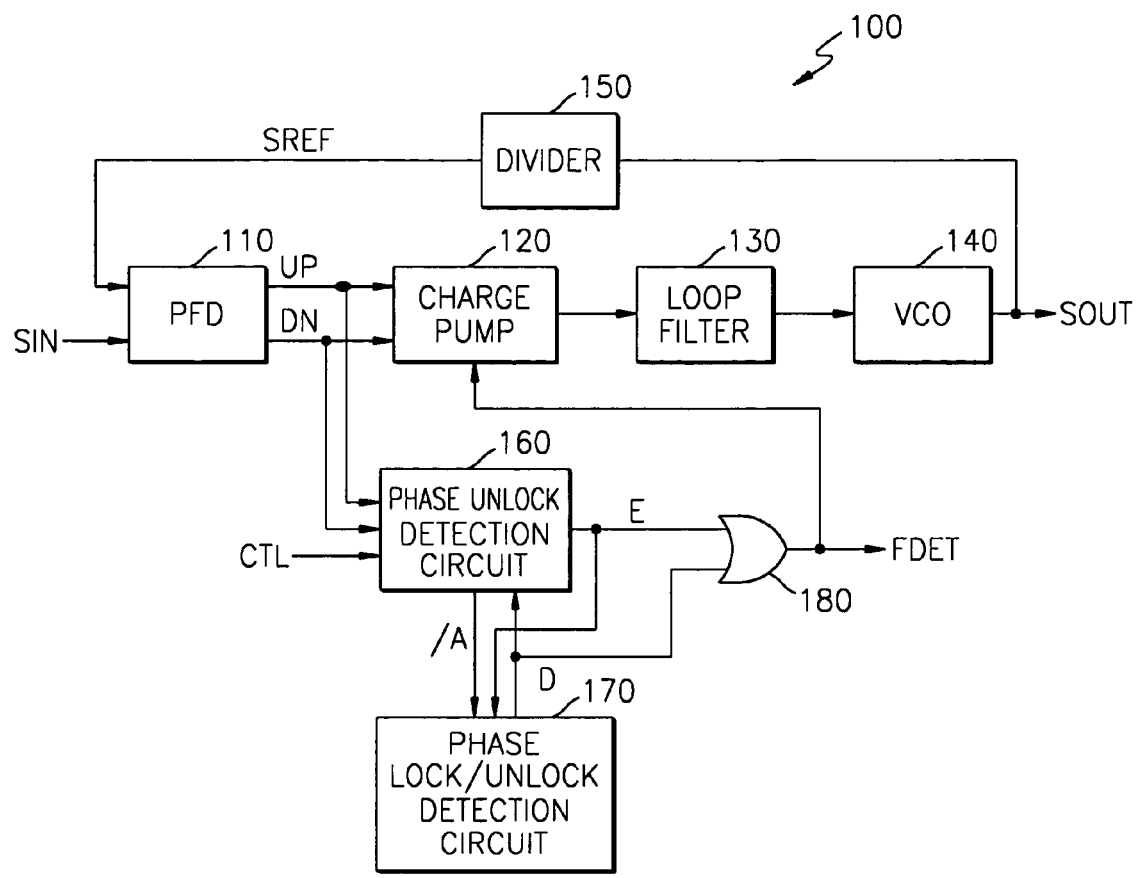
FIG. 4 is a block diagram of a PLL with an improved phase lock/unlock detection function, according to an exemplary embodiment of the present invention.

FIG. 4 is a block diagram of a Phase Locked Loop (PLL) with an improved phase lock/unlock detection function, according to an exemplary embodiment of the present invention.

Referring to FIG. 4, a PLL 100 includes a Phase Frequency Detector (PFD) 110, a charge pump 120, a loop filter 130, a Voltage Controlled Oscillator (VCO) 140, a divider 150, a phase unlock detection circuit 160, a phase lock/unlock detection circuit 170, and an output circuit 180.

The PFD 110 compares a phase and frequency of an input synchronization signal SIN to that of a reference synchronization signal SREF and generates an up signal UP or a down signal DN.

The charge pump 120 controls a charge or discharge of the loop filter 130 according to the up signal UP or down signal DN. The output frequency of the VCO 140 is determined according to a loop voltage from the loop filter 130. The VCO 140 outputs a predetermined clock pulse signal SOUT with a frequency determined by the loop voltage.

The divider 150 divides the clock pulse signal SOUT and outputs the reference synchronization signal SREF. The phase unlock detection circuit 160 monitors the up signal UP or the down signal DN, quickly detects an initial generation of phase unlock, and outputs a first detection signal E. The phase unlock detection circuit 160 also generates a predetermined reversed first internal signal/A from the up signal UP or the down signal DN, and outputs it to the phase lock/unlock detection circuit 170.

The phase lock/unlock detection circuit 170 detects a phase lock/unlock in response to the reversed first internal signal/A and the first detection signal E, and outputs a second detection signal D.

The output circuit 180 performs an OR operation on the first detection signal E and the second detection signal D, and outputs a third detection signal FDET to the charge pump 120 and a Microcomputer (Micom) (not shown).

Figure 5:
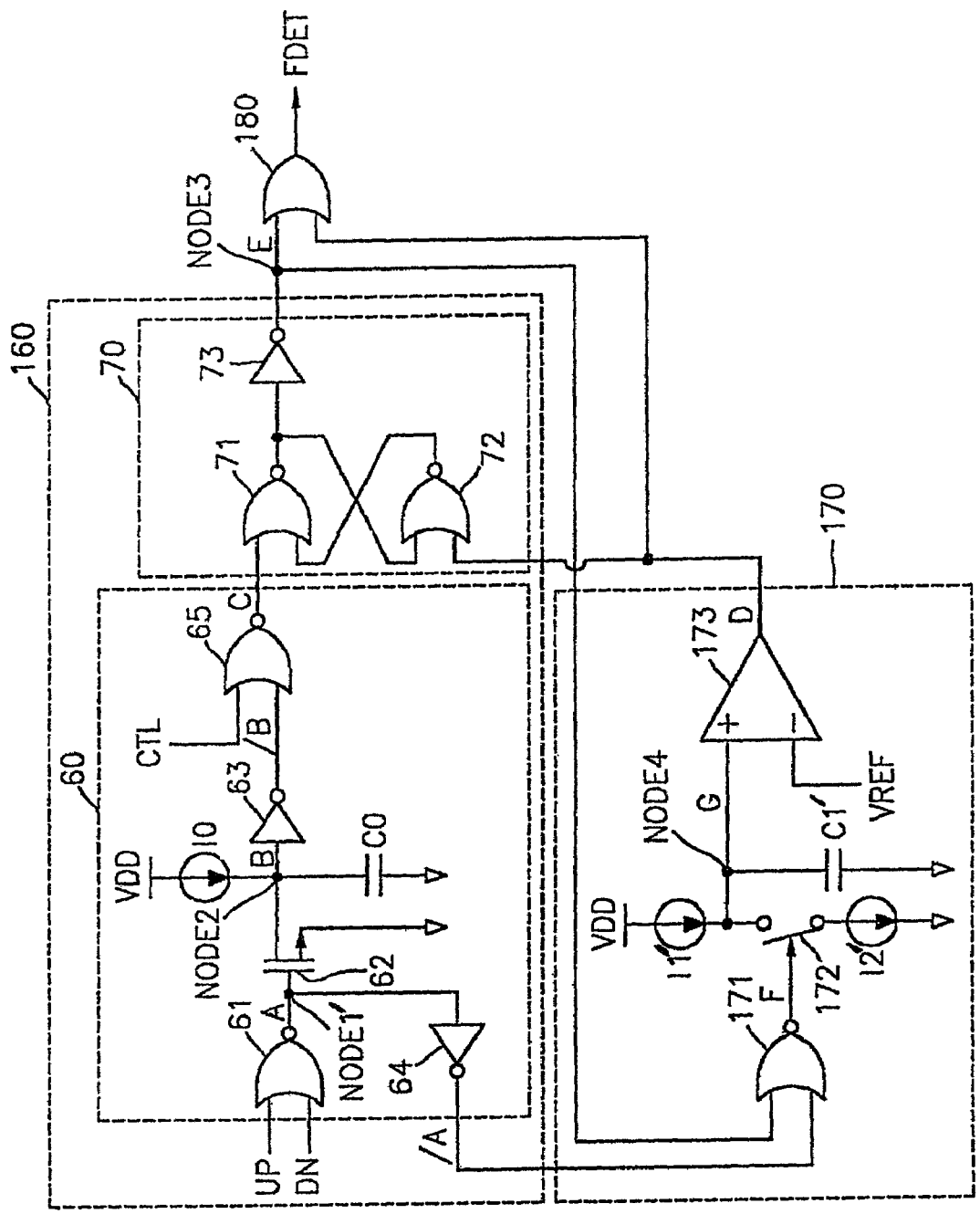
FIG. 5 is a circuit diagram of a phase unlock detection circuit and a phase lock/unlock detection circuit shown in FIG. 4.

FIG. 5 is a circuit diagram of the phase unlock detection circuit 160 and the phase lock/unlock detection circuit 170 shown in FIG. 4.

As shown in FIG. 5, the phase unlock detection circuit 160 includes a pulse width detection circuit 60 and a latch circuit 70.

The phase lock/unlock detection circuit 170 detects the phase lock/unlock and outputs a second detection signal D, in response to the reversed first internal signal/A output from the pulse width detection circuit 60 and the first detection signal E output from the latch circuit 70.

The pulse width detection circuit 60 includes NOR gates 61 and 65, an NMOS transistor 62, inverters 63 and 64, a capacitor C0, and a current source I0. The NOR gate 61 receives the up signal UP and the down signal DN output from the PFD (110 of FIG. 4), performs a NOR-operation thereof, and outputs a first internal signal A to a first node NODE1'.

The first internal signal A is applied to a gate of the NMOS transistor 62. The NMOS transistor 62 having a drain connected to a second node NODE2, and a source connected to a ground voltage. The capacitor C0 is connected to the current source 10 via the second node NODE2. The NMOS transistor 62 is turned on or turned off according to the first internal signal A. When the NMOS transistor 62 is turned off, the capacitor C0 is charged by the current source I0. As a result, the voltage level of a second internal signal B, output to the second node NODE2, changes.

The inverter 63 reverses and outputs the second internal signal B. The inverter 64 reverses and outputs the first internal signal A.

The NOR gate 65 performs a NOR-operation on the output signal of the inverter 63 and a predetermined control signal CTL, and outputs a third internal signal C. The control signal CTL is generated by a control signal generation circuit (not shown), and has a voltage at a "high" level. In addition, the third internal signal C is a pulse signal with a rising edge at the time-point when the voltage level of the second internal signal B becomes higher than the threshold voltage Vth of the inverter 63.

The latch circuit 70 includes NOR gates 71 and 72, and an inverter 73. The NOR gate 71 receives the third internal signal C and the output signal of the NOR gate 72. The NOR gate 72 receives the second detection signal D and the output signal of the NOR gate 71. The third internal signal C is input as a set signal to the latch circuit 70, and the second detection signal D is input as a reset signal to the latch circuit 70. The inverter 73 reverses the output signal of the NOR gate 71 and outputs it as the first detection signal E.

The latch circuit 70 outputs the first detection signal E, having a predetermined voltage level, in response to the third internal signal C. The latch circuit 70 maintains the voltage level of the first detection signal E until the second detection signal D is input.

The phase lock/unlock detection circuit 170 includes a NOR gate 171, a switching unit 172, current sources I1 and I2, a capacitor C1', and a comparator 173.

The NOR gate 171 performs a NOR-operation on the reversed first internal signal/A and the first detection signal E, and outputs a fourth internal signal F. The switching unit 172 is turned on or off by the fourth internal signal F. When the fourth internal signal F is "high", the switching unit 172 is turned on, and when the fourth internal signal F is "blow", the switching unit 172 is turned off. The switching unit 172 is connected between the current sources I1' and I2'. The capacitor C1 is connected to the current source I1 via a fourth node NODE4.

A non-reversed terminal (+) of the comparator 173 is connected to the fourth node NODE4, while a reversed terminal (−) of the comparator 173 is connected to a predetermined reference voltage VREF. The reference voltage VREF has a predetermined voltage level VREFH or VREFL. To allow the comparator 173 to stably detect phase lock/unlock information, the reference voltage VREF has a hysteresis characteristic and the current source I1 is set to a small value. As a result, a certain time delay exists from the initial generation of a phase unlock to detection of the phase unlock information by the comparator 173.

The comparator 173 compares a fifth internal signal G of the fourth node NODE4 to the reference voltage VREF, and outputs the second detection signal D at a "high" or "low" level.

The output circuit 180 performs a logic operation on the first detection signal E and the second detection signal D, and outputs a third detection signal FDET as a final detection signal. The output circuit 180 is an OR gate.

Now, the operation of the phase unlock detection circuit 160 and the phase lock/unlock detection circuit 170 in the PLL 100 according to the present invention will be described with reference to FIGS. 5-7.

Figure 6:
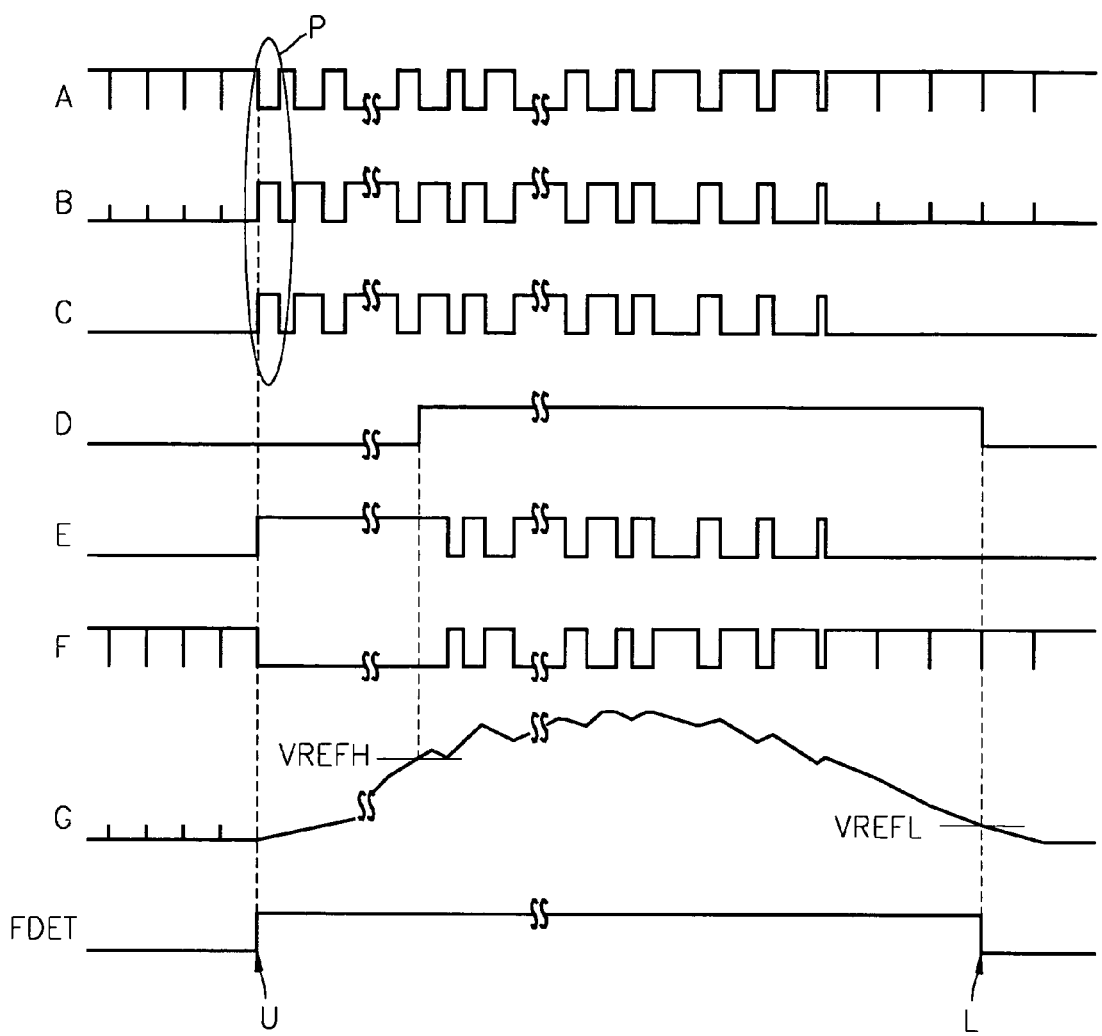
FIG. 6 shows timing diagrams of several input and output signals of the phase unlock detection circuit and the phase lock/unlock detection circuit of FIG. 5.
Figure 7:
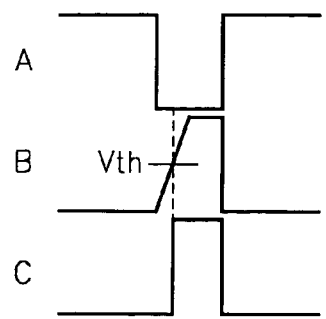
FIG. 7 is an enlarged diagram of the area denoted by "P" of FIG. 6.

FIG. 6 shows timing diagrams of several input and output signals of the phase unlock detection circuit 160 and the phase lock/unlock detection circuit 170 of FIG. 5.

As shown in FIG. 6, the NOR gate 61 performs a NOR-operation on the up signal UP and the down signal DN, and outputs a first internal signal A. The first internal signal A maintains a narrow pulse width below approximately 100 ns (nanoseconds) in a phase locked state.

The NOR gate 61 outputs a first internal signal A at a "low" level when an up signal UP or a down signal at a "high" level is input.

As the first internal signal A settles at a "low" level, the NMOS transistor 62 is turned off. As a result, the capacitor C0 is charged by the electric charge(s) supplied by the current source I0, and the voltage level of the second internal signal B is set at a "high" level. The inverter 63 reverses and outputs the second internal signal B at a "low" level when the second internal signal B is higher than the threshold voltage Vth of the inverter 63, as shown in FIG. 7.

The NOR gate 65 performs a NOR-operation on a control signal CTL at a "low" level and an output signal from the inverter 63 at a "low" level, and outputs a third internal signal C at a "high" level. The third internal signal C is a pulse signal with a rising edge at the time-point when the voltage level of the second internal signal B becomes higher than the threshold voltage Vth of the inverter 63.

The control signal CTL is a signal for maintaining the third internal signal C at a low level while the PFD (110 of FIG. 4) outputs the high level of the up signal UP or the down signal DN.

The third internal signal C is input as a set signal SET to the latch circuit 70. Later, the latch circuit 70 outputs the first detection signal B to the third node NODE3. The first detection signal E is a signal indicating the initial generation of a phase unlock. The three internal signals A, B, and C are shown in mutual synchronism at P in FIG. 6.

To prevent an alternating unlock and lock state from being generated frequently and to stabilize operation of the whole system, the latch circuit 70 maintains an unlock state for a predetermined period after the phase unlock is generated.

While this is taking place, the NOR gate 171 of the phase lock/unlock detection circuit 170 performs a NOR-operation on the reversed first internal signal/A output from the inverter 64 and the first detection signal E, and outputs a fourth internal signal F.

Because the reversed first internal signal/A is at a "high" level and the first detection signal E is also at a "high" level, the fourth internal signal F is set at a "low" level.

As the fourth internal signal F is set at a "low" level, the switching unit 172 is turned off, and electric charge(s) supplied by the current source I1 charge the capacitor C1. As a result, the voltage level of the fifth internal signal G, output to the fourth node NODE4, becomes gradually higher. The comparator 173 outputs the second detection signal D at a "high" level when the voltage level of the fifth internal signal G is higher than a predetermined reference voltage VREFH.

Where, the time taken for the comparator 173 to output the second detection signal D at a "high" level is calculated using equation 1.

$$\text{time} = \text{reference voltage } (VREFH) \times (\text{amount of electric charge in capacitor C1/current amount of current source } (I1)) \quad (1)$$

Thereafter, as the second detection signal D becomes a "high" level, the latch circuit 70 is reset and the phase of the first detection signal E becomes equal to the phase of the third internal signal C.

As a phase difference between the input synchronization signal SIN and the reference synchronization signal SREF is reduced by the locking operation of the PLL (100 of FIG. 4), the "low" level interval of the up signal UP and down signal DN becomes longer. As a result, the "high" level interval of the first internal signal A becomes longer, as seen in FIG. 6. The "low" level interval of the first internal signal/A, reversed by the inverter 64, also becomes longer.

In addition, the phase of the reversed first internal signal/A becomes equivalent to that of the first detection signal E and the "low" level intervals of both signals become longer. Accordingly, the "high" level interval of the fourth internal signal F becomes gradually longer. As a result, the switching unit 172 is turned on.

As the switching unit 172 is turned on, the electric charge(s) of the current source I1 are supplied to the current source I2. The current source I2, has a value double that of the current source I1.

Accordingly, the voltage level of the fifth internal signal G of the fourth node NODE4 becomes gradually lower.

The comparator 173 outputs a second detection signal D at a "low" level, when the voltage level of the fifth internal signal G is lower than the reference voltage level VREFL, as shown in FIG. 6.

Because the first detection signal E is in the "low" state, the output circuit 180 outputs a third detection signal FDET at a "low" level as a final detection signal when the second detection signal D is set at the "low" level.

As shown in FIG. 6, the third detection signal FDET is set to a "high" level in response to the first detection signal E and is set to a "low" level in response to the second detection signal D.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A phase locked loop (PLL) which generates a clock pulse signal at a frequency from a synchronization signal of a cathode ray tube (CRT) monitor, the PLL comprising:
    a phase frequency detector (PFD) which compares a phase and frequency of the synchronization signal to that of a reference signal, and outputs an up signal or a down signal;
    a charge pump which outputs a pumping current in response to the up or down signal;
    a loop filter which outputs a control voltage according to the pumping current;
    a voltage controlled oscillator (VCO) which outputs a clock pulse signal having a frequency determined by the control voltage;
    a divider which divides the clock pulse signal by a division ratio and outputs the reference signal;
    a phase unlock detection circuit which detects an initial phase unlock from the up or down signal for outputting a first detection signal, and outputs a first internal control signal according to the up or down signal;
    a phase lock/unlock detection circuit which outputs a second detection signal in response to the first internal control signal and the first detection signal; and
    an output circuit which performs a logic operation on the first detection signal and the second detection signal, and outputs a third detection signal.

2. The PLL of claim 1, wherein the phase unlock detection circuit comprises:
    a pulse width detection circuit which outputs a pulse signal from the up or down signal at an initial generation time of phase unlock, in response to a control signal; and
    a latch circuit which outputs the first detection signal in response to the pulse signal.

3. The PLL of claim 2, wherein the pulse width detection circuit comprises:
    a first NOR gate which performs a logic operation on the up or down signal and outputs the first internal signal;
    a first inverter which reverses the first internal signal and outputs the first internal control signal;
    a NMOS transistor which is turned on or turned off in response to the first internal signal;
    a capacitor which is charged by a first current source when the NMOS transistor is turned off, and changes a voltage level of a second internal signal, the second internal signal output to a control node;
    a second inverter which reverses the second internal signal and outputs a second internal control signal; and
    a second NOR gate which performs a logic operation on the control signal and the second internal control signal, and outputs the pulse signal.

4. The PLL of claim 3, wherein the pulse signal has a rising edge at a time-point when the voltage level of the second internal signal becomes higher than a threshold voltage of the second inverter.

5. The PLL of claim 3, wherein the latch circuit comprises:
    a third NOR gate which performs a logic operation on the pulse signal and an output of a fourth NOR gate;
    a fourth NOR gate which performs a logic operation on the output of the third NOR gate and the second detection signal of the phase lock/unlock detection circuit; and
    a third inverter which reverses the output of the third NOR gate and outputs the first detection signal.

6. The PLL of claim 5, wherein the phase lock/unlock detection circuit comprises:
    a fifth NOR gate which performs a logic operation on the first detection signal and the first internal control signal output by the phase unlock detection circuit and outputs a third internal signal;
    a first switching unit which is turned on or off in response to the third internal signal;
    a capacitor which is charged by a second current source when the switch is turned off and charges the voltage level of a fourth internal signal; and
    a comparator which outputs the second detection signal in response to the voltage level of the fourth internal signal and a reference voltage.

7. The PLL of claim 6, wherein the comparator outputs the second detection signal at a high level when the voltage level of the fourth internal signal is higher than the reference voltage.

8. The PLL of claim 6, wherein the comparator outputs the second detection signal at a low level when the voltage level of the fourth internal signal is lower than the reference voltage.

9. The PLL of claim 1, wherein the output circuit is an OR gate.

10. The PLL of claim 9, wherein the output circuit outputs a third detection signal having a first logic level indicating a phase unlocked state, in response to the first detection signal, or a third detection signal having a second logic level indicating a phase locked state, in response to the second detection signal.

11. A phase locked loop (PLL), which generates a clock pulse signal at a frequency from a synchronization signal of a cathode ray tube (CRT) monitor, comprising:
- a phase locking circuit comprising a phase frequency detector for receiving a reference signal and the synchronization signal and transmitting an up signal and a down signal in response to the reference signal and the synchronization signal;
- a phase unlock detection circuit for detecting an initial phase unlock from the up or down signals and transmitting a first detection signal and a first internal control signal in response to the up or down signal;
- a phase lock/unlock detection circuit for receiving the first internal control signal and the first detection signal and transmitting a second detection signal; and
- an output circuit for receiving the first and second detection signals and for transmitting a third detection signal.

12. The PLL of claim 11, wherein the third detection signal is transmitted to the phase locking circuit.

13. The PLL of claim 11, wherein the phase unlock detection circuit receives a control signal from a control signal generation circuit.

14. The PLL of claim 11, wherein the phase locking circuit further comprises:
- a charge pump for receiving the up and down signals and the third detection signal and transmitting a pumping current in response to the up or down signals;
- a loop filter for receiving the pumping current and transmitting a control voltage;
- a voltage controlled oscillator (VCO) for receiving the control voltage and transmitting a clock pulse signal having a frequency determined by the control voltage; and
- a divider for receiving the clock pulse signal and dividing the clock pulse signal by a division ratio and transmitting the reference signal.

15. The PLL of claim 11, wherein the output circuit is an OR gate.

16. The PLL of claim 15, wherein the output circuit transmits a third detection signal having a first logic level indicating a phase unlocked state, in response to the first detection signal, or a third detection signal having a second logic level indicating a phase locked state, in response to the second detection signal.

* * * * *